United States Patent [19]

Yanick

[11] 4,156,116

[45] May 22, 1979

[54] HEARING AIDS USING SINGLE SIDE BAND CLIPPING WITH OUTPUT COMPRESSION AMP

[76] Inventor: Paul Yanick, 673 Wood Ave., Edison, N.J. 08817

[21] Appl. No.: 890,069

[22] Filed: Mar. 27, 1978

[51] Int. Cl.² .......................................... H04R 25/00
[52] U.S. Cl. ................................................. 179/107 R
[58] Field of Search .................................... 170/107 R

[56] References Cited

U.S. PATENT DOCUMENTS 4,052,571  10/1977  Gregory et al. ................. 179/107 R Primary Examiner—George G. Stellar
Attorney, Agent, or Firm—Arthur L. Plevy

[57] ABSTRACT

A hearing aid apparatus employs a single side band modulator which serves to convert an audio band of frequencies into an upper and lower side band signal. One of the side band signals is filtered and clipped. The clipped side band signal is then demodulated to provide an output audio signal relatively free of undesirable low frequency peaks. The output audio signal is then applied to a compressor amplifier circuit for application to the ear of a handicapped user.

7 Claims, 4 Drawing Figures

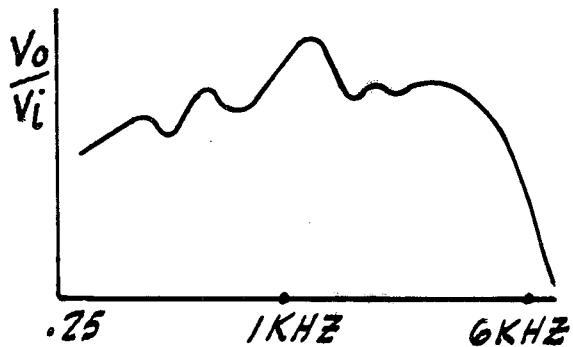
Fig.1.
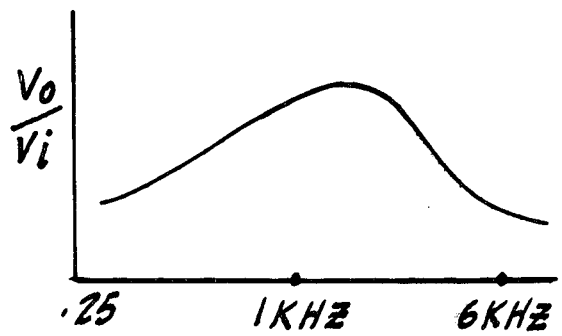
Fig.2.
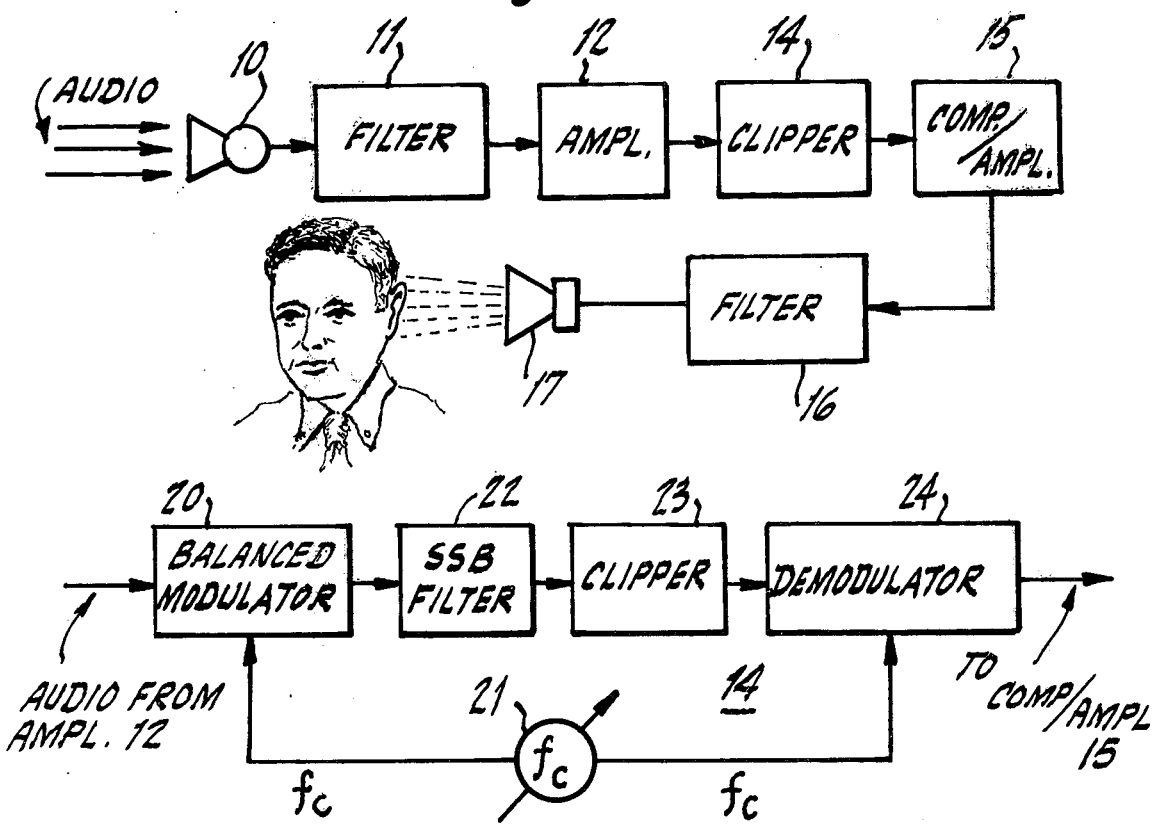
Fig.3.
Fig.4.

HEARING AIDS USING SINGLE SIDE BAND CLIPPING WITH OUTPUT COMPRESSION AMP

BACKGROUND OF THE INVENTION

This invention relates to a hearing aid device and more particularly to a hearing aid which incorporated improved clipping circuitry to provide improved performance.

Hearing aid users with sensorineural hearing losses commonly complain of an inadequate listening level at which they are comfortable. Further complaints of such users involve a loudness discomfort attendant with an inability of the user to understand speech in noisy situations. The inadequate comfortable listening level is due partly to the frequency response of the hearing aid as effecting the user's ear and the general inability of the hearing aid circuit to provide adaptive filtering as a function of the listening level of the user.

Generally speaking, the real ear frequency response in combination with the hearing aid frequency response are attendant with the following limitations:

Basically, low frequcny energy having large peak amplitudes serves to control the gain level at which the user is comfortable. For example, a hearing aid user will adjust his volume control to a comfortable listening level by making reference to low frequency peaks which are the more intense stimuli. In certain hearing aids which employ input compression circuits, the low frequency peaks serve to reduce the compressor gain which deprives the user of a comfortable listening gain setting.

In other devices employing output compression circuits, the low frequency peaks result in large compression ratios. The operation of the low energy peaks in such aids result in severe intensity distortion of the signal. Hence, the user is unable to resolve differences in intensity and his hearing acuity is degraded.

A technique of reducing low frequency energy peaks is commonly referred to as peak clipping. Such peak clipping circuits are employed in conventional hearing aids. In any event, the operation of a peak clipper serves to generate high levels of harmonic distortion. Particularly, such clippers may operate to generate high levels of third harmonic distortion. This distortion produced degrades the speech information by masking the weaker speech elements and hence, the user is deprived of meaningful cues.

It is therefore an object of the present invention to provide a hearing aid which substantially reduces low frequency peak energy, while maintaining a sufficient gain and response to enable reliable hearing acuity.

BRIEF DESCRIPTION OF PREFERRED EMBODIMENT

In a hearing aid for a handicapped user, said aid of the type including an input pickup transducer for responding to propagated acoustic signals to provide at an output an electrical signal within a given frequency range indicative of said acoustic signals, including means for amplifying said signal prior to application of the same to the ear of a handicapped user, the combination therewith of apparatus for clipping said signal prior to application of the same to the ear of a handicapped user, comprising a modulator responsive to said electrical signal to provide a higher frequency signal at an output having relatively the same bandwidth as said electrical signal, clipping means coupled to said output of said modulator for clipping said higher frequency signal, demodulator means coupled to said clipping means and responsive to said clipped signal to provide an output signal within said given frequency range, and means responsive to said output signal for application of the same to an ear of a user.

BRIEF DESCRIPTION OF THE FIGURES

FIG. 1 is a graph showing a typical frequency response of a conventional hearing aid.

FIG. 2 is a graph showing a typical frequency response of a hearing aid according to this invention.

FIG. 3 is a block diagram of a hearing aid according to this invention.

FIG. 4 is a block diagram of a clipping circuit according to this invention and to be employed in conjunction with the hearing aid shown in FIG. 3.

DETAILED DESCRIPTION OF THE DRAWINGS

Referring to FIG. 1, there is shown a typical frequency response of a conventional hearing aid. As one can see, the hearing aid exhibits a series of peaks over its desired frequency range. The real ear frequency response is defined as the frequency response of the hearing aid as shown in FIG. 1 as affecting the ear of the user.

Essentially, the smoothness of the real ear frequency response is important and should be considered in designing hearing aids in order to eliminate the peaking of the various frequencies in the acoustic band of speech. As indicated above, the peaks in the frequency response severely limit the useable dynamic range of hearing, especially in regard to a handicapped user. In most hearing aids, the user controls the gain and does so according to the low energy peaks. In these instances where there is a great deal of low energy noise, the user controlling the gain may adjust the same so that insufficient gain is afforded for weaker speech components.

Referring to FIG. 2, there is shown a desired frequency response for a handicapped user employing a hearing aid.

Essentially, there is shown in FIG. 2 a smoothly varying response. By providing such a response, one can achieve a 25 db increase in the useable aided dynamic range. In order to obtain a response as shown in FIG. 2, the peaks have to be removed as indicated above. If this is accomplished by peak clipping, one induces harmonic distortion which is inherent with other problems.

Typically, in a speech signal, the consonants are some 12 db to 28 db below most vowels. In this manner, a typical speech signal contains spikes or peaks of energy. This phenonenon known as the peak factor is the ratio of extreme peaks of amplitude to the rms amplitude. The peak factor for speech intervals is typically about 10 db to 20 db. Thus, the concept of clipping extreme peaks of amplitude while eliminating peaks in the frequency response of the hearing aid provides superior operation. One immediate advantage of eliminating peaks in the speech signal and peaks in the hearing aid response is that the loudness discomfort problems are reduced. With these factors incorporated in a hearing aid, the user need not reduce the gain due to discomfort caused by the peaks and hence, he will not sacrifice acuity. Another advantage is that when the user is in a noisy environment or is exposed to high peak impulse noise, he will be protected from these noise effects by circuitry designed according to this invention. It is well known that clipping speech does not result in a loss of speech information and hence, one can clip speech and reamplify it to provide a user with proper signal strength.

Referring to FIG. 3, there is shown a block diagram of an improved hearing aid according to this invention. Conventionally, the hearing aid includes an input transducer or microphone 10. The microphone 10 is a conventional device found in most hearing aids and has a frequency response capable of accommodating a typical audio band.

As is well known, the voice band width may be restricted to a range of 200 Hz to 3,000 Hz without reducing the average word intelligibility to any significant degree. In any event, the restriction of the band width to a range of 200 Hz to 2,000 Hz reduces the average word intelligibiltiy in the absence of noise by only five percent. However, noise does play an important role and it is also desired in a case of a hearing aid to use as much of the frequency range as possible in order to give the handicapped user as much information as his impaired ear is capable of accommodating. In this manner, the frequency response of the microphone 10 could be from 200 Hz to 10,000 Hz.

The microphone 10 is coupled to the input of a filter 11. The filter network 11 is normally shaped by referring to the equal loudness curves of the particular handicapped user. In this manner, the filter is varied to provide a clinician with a means to shape the real ear frequency response of the user to attempt to parallel the normal audibility curve.

Essentially, the filter 11 is specified by the particular handicap of a user. When designing a hearing aid, the audiologist uses an adjustable filter which also has the ability to change the roll off at various frequencies. In any event, the filter 11 can be selected accordingly.

Shown coupled to the output of the filter 11 is an amplifier circuit 12. The amplifier circuit 12 may provide a gain between 15 db to 30 db; which gain may be variable.

Coupled to the output of the amplifier is a clipping circuit 14. As will be explained, the particular clipping circuit 14 employs a high frequency carrier which operates to translate entire speech spectrums to a higher frequency by means of a balanced modulator. Essentially, the clipping circuit as will be described, employs a single side band modulation technique to enable clipping of the signal without substantial harmonic distortion.

Briefly, the clipping section employs a single side band modulator having an output filter. The filter at the output of the modulator has a sharp roll off to attenuate the upper sideband about forty decibels. The output of the filter contains the lower side band as will be explained. The single side band signal is then clipped and demodulated so that an audio signal is available at the output of the clipper 14. In this manner, the resulting distortion products from the clipping process are separated from the audio signal. Therefore, the intermodulation and harmonic distortion products as generated by conventional hearing aids are substantially reduced. This reduction of undesirable distortion provides the user with a clearer signal. Any additional distortion generated by the peaks in the speech and any peaks in the response of the hearing aid are also reduced.

The output of the clipper circuit is coupled to the input of a compressor amplifier 15. The compression ratio of amplifier 15 is selected to match the particular user's dynamic range of hearing. As is well known, compression has the effect of increasing the gain for the softer sounds. The use of a compressor amplifier 15 with the clipper circuit 14 enhances the overall performance of the hearing aid dramatically.

As indicated above, one of the disadvantages of compressors in conventional hearing aids is that the peaked spectrum components serve to reduce compressor gain and hence, effects the level of the signal sent to the ear of the user. In the circuit described in FIG. 3, this effect is substantially reduced and the compressor 15 is extremely stable over the entire speech band due to the operation of the clipper circuit 14.

The output of the compressor amplifier 15 is then coupled to an output filter 16; which filter 16 has a band width determined by the audio band to be supplied to the ear of the handicapped user by means of an output transducer 17. As is known, the filter 16 and the output transducer 17 can further be tailored to the particular hearing requirements of a user.

Referring to FIG. 4, there is shown a more detailed block diagram of a clipping apparatus as 14 of FIG. 1. Essentially, the audio signal as available at the output of amplifier 12 is supplied to one input of a balanced modulator circuit 20. A balanced modulator is a well known circuit component used in single side band systems. Various circuits may be employed to provide a side band signal and many examples of balanced modulator circuits are known in the art. For examples of typical circuits which may be employed for the modulator 20, reference is made to The Radio Handbook, 15th Edition (published by the Editors and Engineers of Summerland, California) pages 332-335.

The balanced modulator 20 as indicated, receives the audio signal at one input and a carrier signal at another input. The carrier signal is supplied by oscillator 21; which may for example, be an oscillator of conventional design operating at a frequency of 30 KHz. Examples of oscillator circuits as 21 are also well known in the art.

Essentially, the output of the modulator 20 consists of a double side band signal with the carrier frequency substantially reduced. It is noted that the frequency of 30 KHz for the carrier is by way of example only and other frequencies may be employed as well.

In any event, for an audio signal of 1 KHz, the side bands will be an upper side band of 31 KHz and a lower side band of 29 KHz. As indicated above, the lower side band is employed and retrieved by means of the filter 22 which is coupled to the output of the modulator 20. In this manner, the filter 22 serves to pass only the lower side band. As indicated, the filter 22 has a sharp roll off and examples of suitable filters are also given in the above noted text.

The lower side band output of filter 22 is then directed to the input of a typical clipper circuit 23. Essentially, a clipper circuit as 23 serves to limit the amplitude of the side band only at a predetermined level. Clipping circuits are well known in the art and employ back to back diodes or Zener diodes to symmetrically limit the amplitude of the input signal at the output of the clipper 23.

Essentially, an ideal clipper citcuit transfers only the portions of a signal which is either more positive or negative than some specific voltage. Examples of suitable clipper circuits may be had by referring to a text entitled Electronic Designers Handbook, 1957 by McGraw Hill Book Company, Chapter 12 entitled Clippers, Limiters and Clamps.

The output of the clipper circuit which contains the amplitude limited lower side band is applied to the input of a demodulator 24. The other input to the demodulator 24 is supplied from the oscillator 21. The demodulator 24 serves to subtract the oscillator frequency from the clipper lower side band to thereby derive at the output of the demodulator, an audio signal. The audio signal available at the output of the demodulator 24 is of the exact frequency range as applied to the input of the modulator 20, but has the peaks limited according to the action of the clipper 14.

It is noted that since the same oscillator signal is used both to modulate and demodulate within the clipper circuit 14, it does not have to be accurate or crystal controlled as the frequency of the oscillator is added and then subtracted and hence, the entire audio spectrum of frequencies is accurately retained by the operation of the circuit.

Since the carrier frequency is relatively high compared to the audio band all major harmonic products produced are substantially eliminated due to the fact that the complete upper side band and its energy content are not operated upon by the system.

The audio signal at the output of demodulator 24 as processed by the clipper circuit shown exhibits an improvement in the intelligibility threshold without any substantial loss in information content. Thus, as indicated above, this processed signal can then be applied to the compressor amplifier 15 without any of the disadvantages afforded by prior art devices regarding high energy peaks as effecting the compressor gain or compression ratio. The output wave form is relatively undistorted and is not square as in conventional peak clipping but is a rounded signal due to the processing of the lower side band and the elimination of the intermodulation and harmonic distortion products. Processing of a signal in this manner enables one to provide a clear speech signal to the handicapped, thereby retaining more information for his use.

It is, of course, understood that the particular clipping threshold can be adjusted in order to further optimize the system and to further accommodate the characteristics of the particular user.

I claim:

1. A hearing aid apparatus for a handicapped user, comprising:
    (a) input pickup means for responding to acoustic signals to provide at an output an electrical signal indicative of said acoustic signal,
    (b) filter means coupled to said pickup means and operative to provide at an output a signal encompassing a predetermined frequency range,
    (c) modulation means coupled to said filter and responsive to said signal to provide a sideband signal at a frequency range relatively higher than said predetermined range,
    (d) means for limiting the amplitude of said sideband signal,
    (e) demodulating means responsive to said limited sideband signal to translate the same to said predetermined frequency range,
    (f) a compressor amplifier responsive to said translated signal for selectively compressing said signal,
    (g) output means for applying said compressed translated signal to the ear of a handicapped user.

2. The hearing aid according to claim 1 wherein said electrical signal has a bandwidth of approximately 6 KHz.

3. The hearing aid according to claim 1 further including a carrier frequency source for providing a high frequency carrier signal at an output for application of said signal to both said modulation and demodulating means.

4. The hearing aid according to claim 3 wherein said carrier signal is substantially higher in frequency than any frequency contained in said electrical signal.

5. The hearing aid according to claim 4 wherein said carrier frequency is approximately 30 KHz.

6. The hearing aid apparatus according to claim 1 wherein said modulation means is a balanced modulator having a first input for receiving said electrical signal and a second input for receiving a carrier reference signal, to provide at an output a lower and upper sideband signal according to said carrier signal as modifying said electrical signal.

7. The hearing aid according to claim 6 further including a filter coupled to said output of said balanced modulator and operative to propagate said lower sideband signal at an output.

* * * * *